United States Patent [19]

Chang et al.

[11] Patent Number: 4,538,165

[45] Date of Patent: Aug. 27, 1985

[54] FET WITH HETEROJUNCTION INDUCED CHANNEL

[75] Inventors: Chin-An Chang, Peekskill; Leroy L. Chang, Goldens Bridge; Leo Esaki, Chappaqua; Emilio E. Mendez, Croton-on-Hudson, all of N.Y.

[73] Assignee: International Business Machines Corporation, Armonk, N.Y.

[21] Appl. No.: 586,497

[22] Filed: Mar. 5, 1984

Related U.S. Application Data

[62] Division of Ser. No. 355,942, Mar. 8, 1982.

[51] Int. Cl.³ .................. H01L 29/80; H01L 29/205
[52] U.S. Cl. ........................................ 357/22; 357/15; 357/16
[58] Field of Search .............................. 357/16, 22, 15

[56] References Cited

U.S. PATENT DOCUMENTS

| | | | |
|---|---|---|---|
| 4,163,237 | 7/1979 | Dingle et al. | 357/16 |
| 4,173,763 | 11/1979 | Chang et al. | 357/12 |
| 4,236,165 | 11/1980 | Kawashima et al. | 357/16 |
| 4,236,166 | 11/1980 | Cho et al. | 357/22 |
| 4,250,515 | 2/1981 | Esaki et al. | 357/16 |
| 4,424,525 | 1/1984 | Mimura | 357/16 |

OTHER PUBLICATIONS

Ohno et al., "Double Heterostructure $Ga_{0.47}In_{0.53}As$ MESFETs by MBE*", *IEEE Electron Device Letters*, vol. EDL-1, No. 8, Aug. 1980, pp. 154–155.
T. Mimura et al., Jap. Jour. of Applied Physics, vol. 19, No. 5, May 1980, pp. L225–L227, "A New Field Effect Transistor with Selectively Doped $GaAs/nAl_xGa_{1-x}As$ Heterojunctions".
Appl. Phys. Lett. 33(7), Oct. 1, 1978, p. 665, "Electron Mobilities in Modulation–Doped Semiconductor Heterojunction Superlattices" by R. Dingle et al.
IBM Technical Disclosure Bulletin, vol. 22, No. 7, Dec. 1979, p. 2952, GaSb–InAs–GaSb p–n–p Heterojunction Transistors For Ultra–High Speeds" by C. A. Chang et al.
Solid State Communications, vol. 39, pp. 79–82, Pergamon Press Ltd. 1981.
J. Vac. Sci. Technol., 19(3), Sep./Oct. 1981, pp. 589–591.

*Primary Examiner*—William D. Larkins
*Assistant Examiner*—Charles S. Small, Jr.
*Attorney, Agent, or Firm*—Alvin J. Riddles

[57] ABSTRACT

The mobility of carriers in the channel region of a field effect transistor can be increased by providing a layered structure wherein electrons are separated from impurities. The channel is made up of external layers of wide bandgap material and internal layers with a narrower bandgap where the bottom of the conduction band of one layer is below the top of the valence band of the adjacent layer. A structure is shown with a layered channel having AlSb external layers and at least one or both of InAs and GaSb internal layers.

4 Claims, 10 Drawing Figures

FIG. 1.1
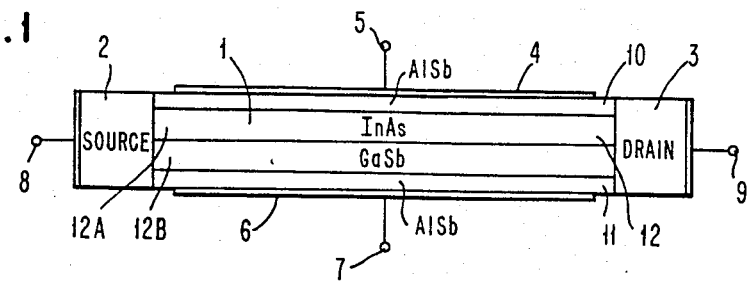
FIG. 2.1
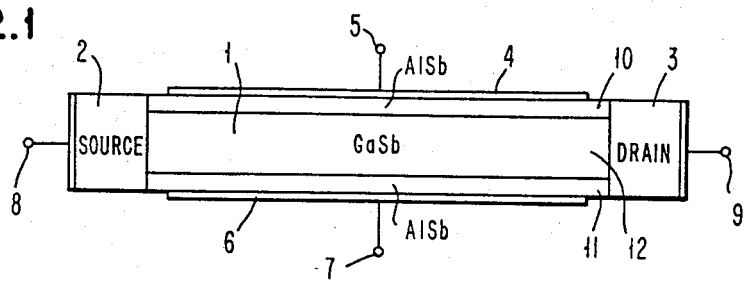
FIG. 3.1
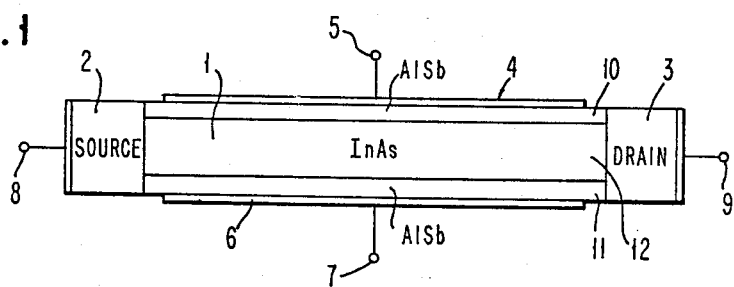
FIG. 4
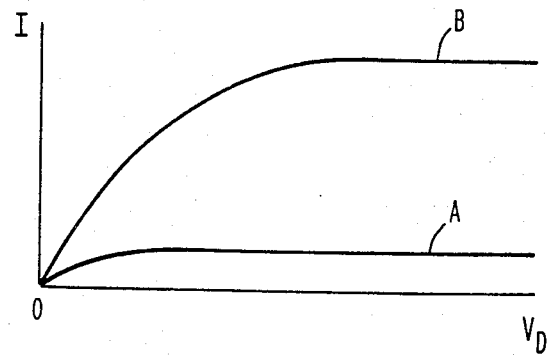

FIG. 1.2
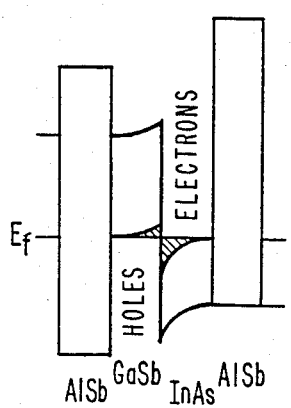
FIG. 1.3
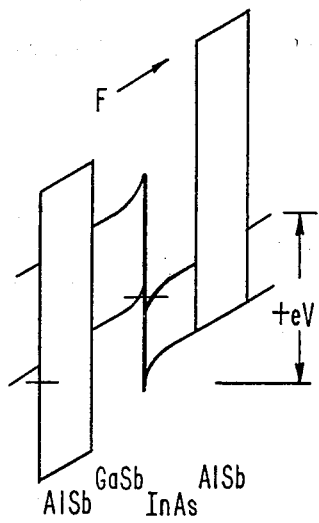
FIG. 1.4
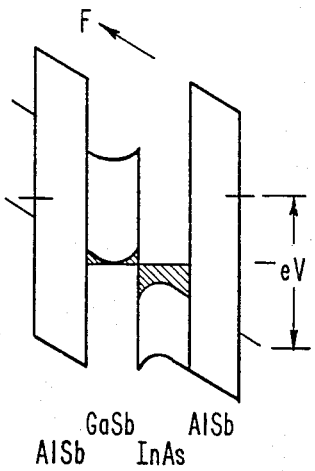

FIG. 2.2
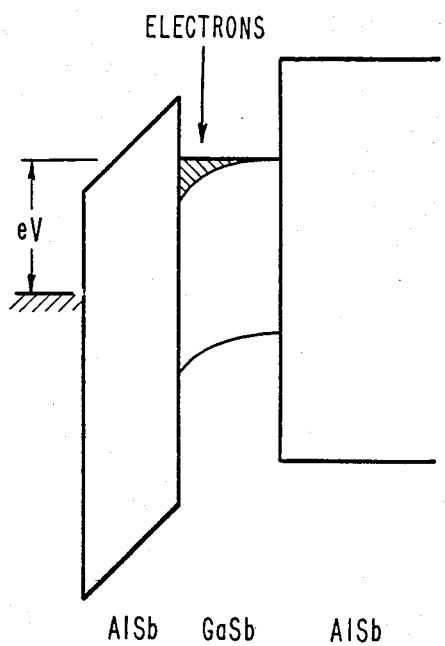
FIG. 3.2
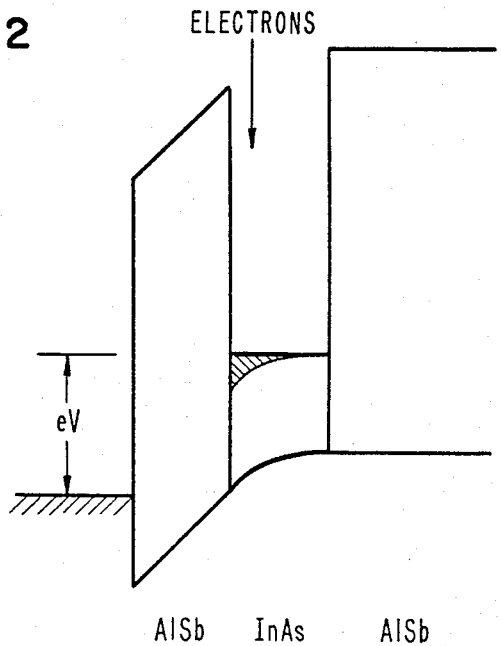

FET WITH HETEROJUNCTION INDUCED CHANNEL

The Government has rights in this invention pursuant to Contract No. DAAG29-78-C-0007 awarded by the U.S. Army Research Office.

This is a division, of application Ser. No. 355,942 filed 03/08/82.

DESCRIPTION

1. Technical Field

The technical field of the invention is in field effect transistors wherein a signal on a gate electrode modulates carrier flow in a channel region from a source to a drain electrode. In general, it has been desirable in such field effect transistor structures to maximize the responsiveness of the carriers in the channel region to signals on the gate electrode, to maximize the mobility of the carriers in traveling from the source to the drain electrode and to minimize the resistivity of the channel region.

2. Background Art

In Applied Physics Letters 33(7), Oct. 1, 1978 the technique of modulation doping is described wherein doping is placed in one layer and the electrons are spatially separated in an adjacent layer providing enhanced carrier mobility.

In U.S. Pat. No. 4,163,237 the modulation doping concept is applied in the channel of an FET transistor.

DESCRIPTION OF THE DRAWINGS

FIGS. 1.1, 2.1 and 3.1 are structural variations of the invention.

FIG. 4 is a current voltage characteristic curve showing the performance of the invention.

FIGS. 1.2, 1.3 and 1.4 are dimensionally correlated energy level diagrams of the structure of FIG. 1.1.

FIG. 2.2 is an energy level diagram of the structure of FIG. 2.1.

FIG. 3.2 is an energy level diagram of the structure of FIG. 3.1.

DISCLOSURE OF THE INVENTION

Figure 5:
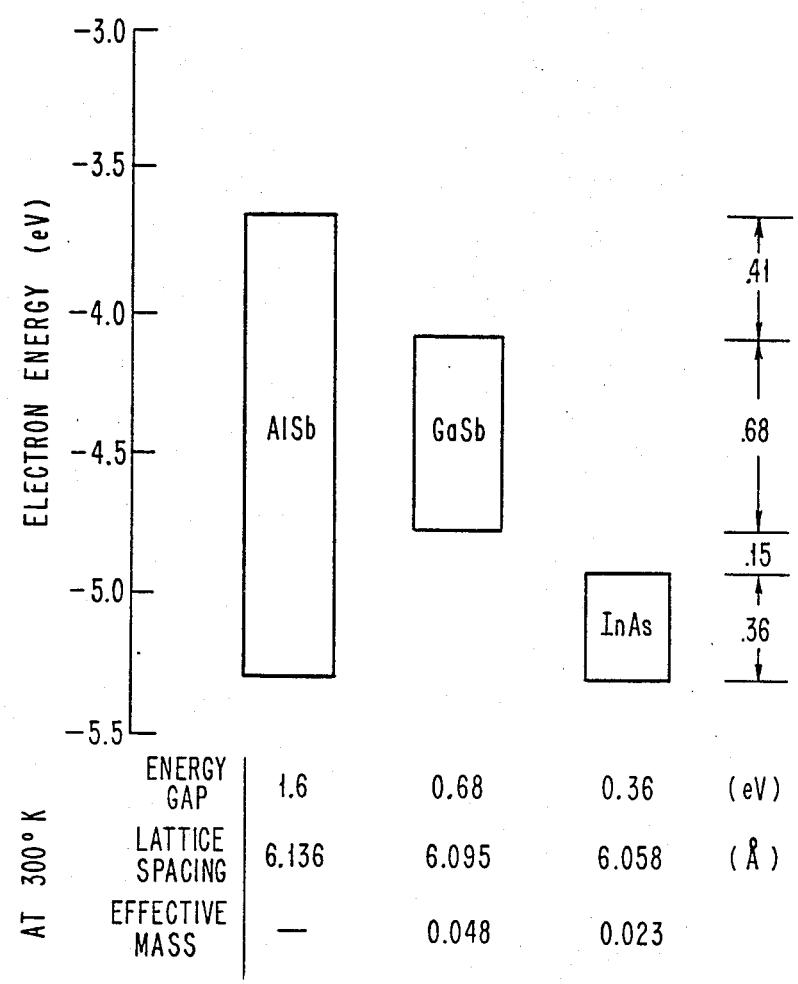
FIG. 5 is an energy level graph and correlated material specifications illustrating the energy properties of the materials involved in the invention.

The invention is a field effect transistor with a layered channel region wherein there are external high bandgap layers and the layers have an energy level relationship such that the electrons and holes of the semiconductor are spatially separated along an interface between the materials. This condition is provided in accordance with the invention by having the channel region of the field effect transistor made up of several parallel layers of materials positioned together between source and drain electrodes. In one embodiment, the parallel layers are epitaxial and are such that the bottom of the conduction band of the material of one layer is located below the top of the valence band of the material of the adjacent layer. This results in an accumulation of free electrons and holes which are equal in number but are spatially separated along the interface between the two materials. The free carriers, particularly the electrons, have extremely high mobilities under these conditions because impurity doping is not the dominant source of carriers and thereby the carriers do not suffer a mobility loss from impurity scattering.

In such a structure, the carriers are responsive to a voltage signal impressed from either or both sides of the channel region.

It will be apparent to one skilled in the art that the channel region of the field effect transistor of the invention is made up of individual layers, which layers must all work together in an epitaxial structure. Thus, the choice of materials is governed not only by the band energy of the individual layer materials but also by the crystal lattice spacing of the particular layer material.

In a second embodiment, it is necessary that the conduction band of the insulating external region is above that of the conduction band of the channel region. In this embodiment, doping in the external region contributes electrons to the channel which have high mobility because they are dissociated from their impurities.

The resulting structure in accordance with the invention provides a channel region wherein carriers are separated from impurities and which thereby have higher mobility.

The detailed description of the invention will be carried forward using the materials GaSb, AlSb and InAs but it will be apparent to one skilled in the art that in the light of the principles set forth the concept of having a layered structure in the channel region whereby the energy levels of the layers produce the condition that the carriers have high mobility may be readily extended by one skilled in the art to other particular materials. In one structure in the channel region, the bottom of the conduction band of one material is located below the top of the valence band of the adjacent material and in another structure a higher bandgap doped external region provides electrons in the channel region. In both types of structures, the electrons have higher mobility.

BEST MODE FOR CARRYING OUT THE INVENTION

The structure of the invention may be compared to a metal oxide semiconductor (MOS) type field effect transistor in that the central current conducting region serves as the channel and it in turn is bounded on each side by a region of higher bandgap that serves as an insulator between the channel and an external gate metal electrode. In one embodiment, the channel region is of a layer of GaSb epitaxial with a layer of InAs with an external region of AlSb on each side as shown in FIG. 1.1. In a second embodiment, the channel region is of a single layer of GaSb or InAs with external regions of AlSb as shown in FIGS. 2.1 and 3.1. Referring to FIG. 1.1, a field effect transistor is illustrated wherein a channel region 1 is longitudinally positioned between a source region 2 and a drain region 3. An ohmic contact 4 with an external electrode 5, and an ohmic contact 6 with an external electrode 7 are provided on each side of the channel region 1 to serve the function of a gate in affecting carrier flow along the channel 1 between the source 2 and the drain 3. Similarly, the source 2 and drain 3 have external electrodes 8 and 9, respectively, for electrical connection purposes.

The channel region 1 in accordance with the invention is made up of an epitaxial structure of a number of layers of semiconductor materials. The external layers 10 and 11 adjacent to the ohmic contacts 4 and 6 have relatively wide energy gaps which extend beyond the energy gap of the central carrier conduction region 12. This condition permits the layers 10 and 11 to serve as a potential barrier in the lateral direction for the carriers involved in conduction in the carrier conduction layer 12.

The carrier conduction layer 12 is made up of an InAs layer 12A and a GaSb layer 12B. The materials of these layers are chosen in accordance with the invention so that the bottom of the conduction band of the layer 12A is located below the top of the valence band of the layer 12B. The material combination of AlSb for the layers 10 and 11, InAs for layer 12A and GaSb for layer 12B satisfies these requirements. This permits the accumulation of free electrons and holes which are equal in number but are spatially separated along the interface between the InAs layer 12A and GaSb layer 12B in the region 12. The free carriers, the electrons in the InAs layer 12A have extremely high mobilities because of their introduction without impurity doping so that they thereby do not have a substantial mobility loss due to impurity scattering. The layers 12A and 12B are relatively equal in thickness and are of the order of 85Å to 400Å in thickness with the behavior changing from that of a narrow gap semiconductor to that of a semimetal as the thickness of the layer 12A increases beyond 85Å. The electron concentration above 85Å exhibits a sharp increase in the vicinity of 100Å thickness.

The embodiments of the invention in FIGS. 2.1 and 3.1 have the same reference numerals as that of FIG. 1.1 and differ by the fact that the region 12 in the case of FIG. 2.1 has a single conduction region of GaSb and in FIG. 3.1 a single conduction region of InAs is provided.

The structures of the invention are responsive to voltage applications in modulating the number of carriers. The structures of FIGS. 1.1, 2.1 and 3.1 have standard field effect transistor current voltage characteristics as is shown in FIG. 4. The curves of FIG. 4 show in curve A one type of performance where there is no gate voltage at the gate 5 electrode and the gate 7 electrode. Another type of performance is illustrated by curve B where the electrode 5 is positive and the electrode 7 is negative.

In order to permit one skilled in the art to more clearly select compatible semiconductor materials in the practice of the principles of the invention, the estimated band edge energies of the barrier material AlSb relative to those of GaSb and InAs are illustrated in connection with FIG. 5 together with correlated specifications at 300° K.

It is necessary in accordance with the invention to provide two external layers that have a bandgap large enough to serve as barriers to lateral carrier flow. The carrier conduction region within the external layers is at least one epitaxially compatible layer of material, each such layer having a bandgap less than the external bandgap and such that the bottom of the conduction band of the carrier conduction region material is below the valence band of any adjacent layer.

Further, since the structure requires high quality epitaxy, the lattice constants must be compatible. The lattice constants of AlSb of 6.13Å, GaSb of 6.095Å, and InAs of 6.058Å are tabulated in FIG. 5 and are sufficiently compatible for purposes of the invention.

The AlSb barrier materials are chosen for their wide energy gaps of 1.6 electron volts and this gap extends over those of GaSb and of InAs as shown in FIG. 5. The AlSb layers 10 and 11 will serve as a potential barrier for both electrons and holes in structures made up of the narrow band gap materials.

Referring next to FIGS. 1.2, 1.3 and 1.4, these are band energy diagrams under respectively no bias, positive bias and negative bias.

In these diagrams, the Fermi energies of the InAs 12A and GaSb 12B layers are assumed respectively to coincide with the conduction and valence band edges. The AlSb layers 10 and 11 are considered to be intrinsic. The voltage polarity has been chosen using the InAs side as the reference electrode.

Referring to FIG. 1.2, the spatially separated holes and electrons are shown on the left for holes in the GaSb region and at the right for electrons in the InAs region, and since the AlSb barriers are so high, they serve as carrier barriers on either side of the region.

Referring next to FIG. 1.3, the effect of a positive bias is shown with the direction of the field F labelled. The slope of the upper portions of the AlSb regions is governed by the potential drop across the thickness of the AlSb layer.

In FIG. 1.4, a negative bias is applied and in comparing FIGS. 1.3 and 1.4, it will be apparent to one skilled in the art that the number of accumulated carriers due to the band bending can be modulated by an applied voltage. In the structures as illustrated the number of two-dimensional carriers and their quantum levels will be significantly modulated by applying electric fields perpendicular to the plane of the layers as by applying signals to conductors 5 and 7 of each of FIGS. 1.1, 2.1 and 3.1 thereby providing the principle for a new type of field effect device.

In order to further illustrate the application of the principles of the invention to structural variations, the energy diagrams for the structures of FIGS. 2.1 and 3.1 are shown respectively in FIGS. 2.2 and 3.2. Here an assumption is made that the conductor electrode from which the bias voltage is established is conductive GaSb, InAs or a metal. With these materials the barrier heights for electrons are sufficiently high for applying fields.

Referring to FIG. 2.2, the energy diagram illustrates the electron accumulation in the GaSb channel region corresponding to layer 12 of FIG. 2.1.

Similarly, in FIG. 3.2, the electron accumulation in the InAs channel region corresponding to layer 12 of FIG. 3.1 is also shown.

The devices shown the familiar FET performance. The characteristics such as the threshold voltage, and accumulation or depletion mode performance are adjustable by controlling p or n doping in the AlSb layers 10 and 11 of FIGS. 1.1, 2.1 and 3.1.

The electron effective masses of InAs (0.023 $m_o$) and GaSb (0.048 $m_o$) are much smaller than that of another material frequently used in the art, GaAs which is 0.067 $m_o$. These values produce high carrier mobility and the devices of the invention outperform the GaAs FETs well known in the art. Since scattering is minimal in these structures, electron mobility will substantially increase with a decrease in temperature and the devices will exhibit improved performance at low temperatures. It will be apparent to one skilled in the art that instead of InAs or GaSb, alloys of InAs and GaSb may be used as materials for the conductive channel layer.

The structures of the invention are readily fabricated by one skilled in the art employing as one illustration a molecular beam epitaxy system which provides control of layer thickness from 10 to a few thousand angstroms. Such a system for the structure of FIG. 1 would have five effusion cells for the elements Al, Sb, Ga, In and As. Additional cells would be provided for dopants. The system would be also provided with apparatus such as a High Energy Electron Diffractometer, an Auger electron spectrometer and a quadrupole mass analyzer which permit in situ analysis of the structure as it is fabricated.

The layers are preferably built up on a [100] oriented GaSb substrate with a homoepitaxial overgrowth of a few hundred Angstroms before beginning.

What has been described is an improved field effect transistor wherein the channel region is made up of layers of selected gap widths bounded by other layers with larger gap widths so that higher mobility is achieved.

Having thus described our invention, what we claim as new and desire to secure by Letters Patent is:

1. In a field effect transistor of the type wherein current in a channel region is influenced by a voltage signal applied to a gate electrode over said channel, the improvement comprising a channel structure of contiguous undoped layers of semiconductor materials wherein an external material is provided between said gate electrode and said channel having a bandgap higher than that of the combined bandgaps of the semiconductor material layers of the conductive channel region and having the further requirement that the conduction band of a first layer of said channel is located below the top of the valence band of a second layer of said channel.

2. In a field effect transistor of the type wherein current in a channel region is influenced by a voltage signal applied to a gate electrode over said channel, the improvement comprising a channel structure of contiguous undoped layers of InAs and GaSb semiconductor materials including an external material of AlSb between said gate electrode and said channel.

3. A field effect transistor having a source and a drain electrode separated by a monocrystalline channel region said channel region having a conductive region of contiguous epitaxial first and second undoped layers of semiconductor materials such that the bottom of the conduction band of said first layer is located below the top of the valence band of said second layer, said channel region having at least one external layer of a semiconductor material extending from source to drain, epitaxial with said central region and having a band gap higher than the combined band gaps of said first and second layers of said conductive region, and a gate electrode essentially coextensive with each said external layer.

4. A field effect transistor having a source and a drain electrode separated by a monocrystalline channel region said channel region having a conductive region of contiguous epitaxial first and second undoped layers of InAs and GaSb semiconductor materials, said channel region having at least one external layer of AlSb semiconductor material extending from source to drain, epitaxial with said central region, and a gate electrode essentially coextensive with each said external layer.

* * * * *